United States Patent [19]

Tanner

[11] 4,451,538

[45] May 29, 1984

[54] HIGH HYDROGEN AMORPHOUS SILICON

[75] Inventor: David P. Tanner, Thousand Oaks, Calif.

[73] Assignee: Atlantic Richfield Company, Los Angeles, Calif.

[21] Appl. No.: 494,199

[22] Filed: May 13, 1983

[51] Int. Cl.³ .............................................. B32B 9/04
[52] U.S. Cl. ................................. 428/447; 427/39; 427/85; 427/87; 427/95
[58] Field of Search ................. 428/447; 427/39, 85, 427/87, 95

Primary Examiner—Bernard D. Pianalto

Attorney, Agent, or Firm—Nilson, Robbins, Dalgarn, Berliner, Carson & Wurst

[57] ABSTRACT

Amorphous silicon having a high band gap is formed by glow discharge in an atmosphere containing $H_2$ and $SiH_4$ in a ratio of at least approximately 9 to 1. The partial pressure of $H_2$ and $SiH_4$ is preferably no more than 1 torr, and the power density of the discharge is preferably no more than 0.08 watts per square centimeter. In the intrinsic form, the material of the present invention has a band gap of approximately 1.95 electron volts (eV). Similar p-type material, formed by adding $B_2H_6$ to the gas atmosphere at approximately 500 parts per million (ppm), has a band gap as high as 1.90 eV.

14 Claims, 3 Drawing Figures

HIGH HYDROGEN AMORPHOUS SILICON

BACKGROUND OF THE INVENTION

The present invention relates to the field of solid state electronics and, more particularly, to amorphous silicon material having an unusually large band gap.

In solar cells having a p-i-n structure, it is desirable to maximize the amount of light reaching the intrinsic (i) layer, since it is the only active layer. No light should be absorbed by either the p or the n layers, if such can be avoided. When amorphous silicon is used in such cells, however, the p layer typically absorbs a substantial amount of light. For example, the band gap of intrinsic amorphous silicon, formed in a glow discharge of $SiH_4$, is typically approximately 1.7 eV. This value drops to between 1.3 and 1.5 eV if the material is doped with boron to produce a p-type layer. As a result, much of the light entering conventional amorphous silicon solar cells is absorbed before reaching the active intrinsic material. In addition, cells having heavily boron doped p layers have experienced material mismatch or interface problems between the p and i layers. Amorphous silicon cells having boron doped p layers have therefore exhibited very poor quality.

There is also a recognized need in the semiconductor field for intrinsic amorphous silicon having a large band gap. For example, it is known that increasing the band gap of the intrinsic layer in a p-i-n solar cell tends to increase the open circuit voltage ($V_{oc}$) of the cell. Amorphous material of high optical gap is useful in tandem thin film solar cells, as well, because the design of such structures contemplates passage of substantial amounts of light by the outer cell structure.

P-type silicon carbide has been proposed for use as the window material in high efficiency amorphous silicon solar cells, as described in Tawada, et al., "Hydrogenated Amorphous Silicon Carbide as a Window Material for High Efficiency a-Si Solar Cells", *Solar Energy Materials* 6, 299-315 (1982). The material is formed by a glow discharge of $CH_4$ (10% in $H_2$), $S_iH_4$ (10% in $H_2$) and $B_2H_6$ (500 ppm). Amorphous silicon solar cells using this material as the window layer have yielded open circuit voltages ($V_{oc}$) of 800 millivolts, short circuit current densities ($J_{sc}$) of 13 milliamperes per square centimeter and a fill factor (FF) of approximately 60%. However, the SiC window material has been found to degrade when exposed to sunlight and may be unsatisfactory for use in solar cells.

Amorphous Si:H films have been produced by glow discharge in atmospheres containing between 5 and 20 times as much $H_2$ as $SiH_4$, as described in Mori et al., "Preparation of High-Conductivity p-Type a-Si:H Films by Penning Discharge", *Jpn. J. Appl. Phys.*, Volume 20, No. 12 (1981). The resulting material, although high in conductivity, has a band gap between 1.2 and 1.5 eV. It represents no improvement over conventional films from the standpoint of light absorption.

Si:H films have also been examined by Matsuda et al., "Boron Doping of Hydrogenated Silicon Thin Films", *Jpn. J. of Appl. Phys.*, Volume 20 L183 (1981). A conventional amorphous silicon film was deposited under "low power" conditions (0.1 watt per square centimeter) and a substantially microcrystalline film was deposited at higher power (1.6 watts per square centimeter). The feed gas at low power did not contain $H_2$, whereas the gas used at high power contained 30 times as much $H_2$ as $SiH_4$. Although the micro crystalline material exhibited a relatively stable band gap of 1.8 eV, the band gap of the amorphous material decreased significantly with boron doping. Matsuda et al. obtained no significant improvement in the optical gap of amorphous films.

Therefore, it is desirable in many applications to provide an amorphous silicon film having a high optical gap both in intrinsic and boron-doped forms.

SUMMARY OF THE INVENTION

The present invention concerns a process of forming amorphous silicon from a glow discharge containing $H_2$ and $SiH_4$, and the product of the process. A gas atmosphere containing $H_2$ and $SiH_4$ in a ratio of at least approximately 9 to 1 is provided at a partial pressure of no less than 1 torr and a flow rate of no more than $10^{-3}$ SCCM per square centimeter of electrode area. A glow discharge is established by discharging electrical power through the atmosphere at a density of no more than 0.08 watts per square centimeter, causing Si:H to be deposited as a thin film on a substrate exposed to the glow discharge. Under these conditions, the deposited film has been found to be substantially "amorphous", as exhibited by conventional x-ray diffraction techniques. That is, any crystalline regions are less than or equal to approximately 20 angstroms across.

The material deposited by the process of the present invention exhibits an extraordinarily large band gap ($E_g$), i.e., approximately 1.95 eV in intrinsic form and up to 1.90 eV in boron-doped p form. Boron doping was accomplished by adding $B_2H_6$ to the gas atmosphere during discharge, resulting in a film of high band gap and relatively high dark conductivity. Thus, the film passes almost all of the sunlight incident on it. When used as the window layer of a p-i-n solar cell, high open circuit voltage ($V_{oc}$) and short circuit current density ($J_{sc}$) are obtained. Most importantly, such cells are highly stable and exhibit relatively high efficiency. In addition, the intrinsic material of the present invention is useful in a number of circumstances, including as the active layer of p-i-n solar cells and as the outer active layer of stacked cells.

BRIEF DESCRIPTION OF THE DRAWINGS

The above and other features of the present invention may be more fully understood from the following detailed description, taken together with the accompanying drawings, wherein similar reference characters refer to similar elements throughout and in which.

DESCRIPTION OF THE PREFERRED EMBODIMENTS

Figure 1:
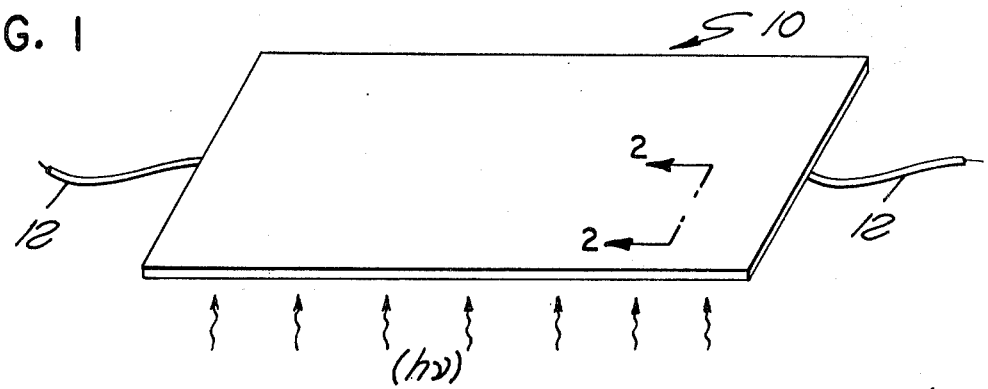
FIG. 1 is a perspective view of a solar panel having at least one semiconductive layer formed according to the present invention.
Figure 2:
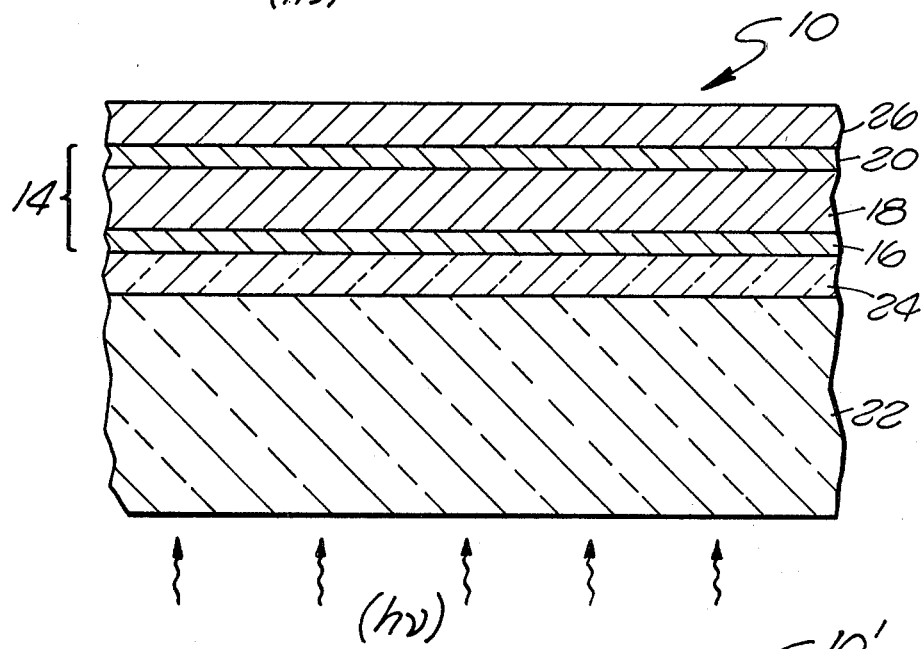
FIG. 2 is an enlarged fragmentary cross-sectional view taken along the line 2—2 of FIG. 1.

With reference generally to FIGS. 1 and 2, a thin film solar panel 10 constructed according to the present invention is connectable to an external circuit (not shown) by a pair of leads 12. Current generated within the panel in response to incoming radiation (hv) is passed to the external circuit through the leads 12.

Referring specifically to FIG. 2, the solar panel 10 comprises a thin film p-i-n structure 14 made up of a p layer 16, an intrinsic layer 18 and an n layer 20, formed in sequence on a glass substrate 22. A front contact 24 is provided between the layer 16 and the glass substrate, and a metallic back contact 26 is provided on the layer 20. Any of the layers of the p-i-n structure 14, and specifically the p layer 16, may be made by the glow discharge process of the present invention. An abundance of $H_2$ gas is provided in a silicon-containing discharge at specific low power, low flow rate conditions. With regard to the p layer 16, doping can be accomplished by adding diborane ($B_2H_6$) gas to the glow discharge, yielding a boron-doped amorphous silicon layer having a band gap ($E_g$) of approximately 1.90 eV in comparison to a band gap of between 1.3 and 1.5 eV for conventional boron-doped amorphous silicon films. The amount of light absorbed by the p layer 16, and thus unavailable for conversion to electrical energy, is drastically reduced in this way. Possible material mismatch and contamination problems at the interface of the p layer 16 and the intrinsic layer 18 are also eliminated by raising the optical gap of the p layer to more closely approximate that of the intrinsic layer.

Referring to the structure of FIG. 2 in greater detail, the front contact 24 is preferably a transparent conductive oxide (TCO) layer, such as indium tin oxide (ITO), tin oxide (TO), or indium oxide (IO). ITO can be deposited onto the substrate 22 at approximately 300 degrees Celsius by vacuum evaporation of indium and tin in an oxygen atmosphere with glow discharge assistance. The glow discharge activates the oxygen to produce a high quality film. TO can be deposited using a chemical vapor process and IO is preferably deposited by reactive evaporation of indium in an activated oxygen atmosphere. When the layer 24 is made of ITO having a resistivity of $4 \times 10^{-4}$ ohm-centimeters, the layer may have a thickness of approximately 2000 angstroms, or less.

The p-i-n structure 14 is preferably formed by sequential deposition from a silicon-containing glow discharge under appropriate conditions. According to the present invention, the p layer 16 is deposited from a gas atmosphere containing $H_2$ and silane ($SiH_4$ and possibly higher silanes), in a ratio of at least 9 to 1. The gas is passed through a suitable deposition chamber at a rate of no more than $10^{-3}$ SCCM per cubic centimeter and a pressure of between approximately 1 and 3 torr. Electrical power is discharged through the gas at a density of between 0.025 and 0.08 watts per square centimeter. For doping purposes, $B_2H_6$ is added to the gas atmosphere at approximately 500 parts per million (ppm) during discharge. The resulting boron-doped amorphous silicon film has an optical gap ($E_g$) between 1.85 and 1.90 eV and a dark conductivity ($\sigma_D$) between approximately $10^{-5}$ and $10^{-6}$ inverse ohm-centimeters. Under these conditions, deposition takes place at the rate of approximately 36 angstroms per minute and is continued for approximately 2.8 minutes to produce a layer approximately 100 angstroms thick.

The intrinsic layer 18 may be deposited under similar conditions, but without addition of $B_2H_6$, to a thickness of approximately 5000 angstroms. Alternatively, the intrinsic layer 18 may be formed in any conventional manner to produce an amorphous layer having a suitable optical gap and conductivity. Similarly, the n layer 20 may be any amorphous or micro-crystalline silicon layer suitable for completion of the p-i-n structure 14. The layer 20 is preferably approximately 500 angstroms thick.

The solar panel 10 is completed by applying the metallic back contact 26 over the p-i-n structure 14. In a preferred embodiment, the back contact 26 may be either screen printed or vacuum deposited to a thickness providing suitable conductivity. When the contact is screen printed from commercially available silver (Ag) paste, it is preferably approximately 25 microns thick.

In operation, the solar panel 10 is exposed to radiation (h$\nu$) which passes through the glass substrate 22 and the front contact 24 to reach the p-i-n structure 14. Because the p layer 16 has a high optical gap and is very thin, incoming light passes readily through it for absorption by the active intrinsic layer 18. The thickness of the intrinsic layer (approximately 5000 angstroms) causes most of the light to be absorbed by it for conversion to electrical energy. Any light passed by the layer 18 is preferably passed by the n layer 20, as well, and is reflected back through the intrinsic layer by the back contact 26.

A cell having the structure of the solar panel 10, and in which only the p layer 16 was deposited according to the teachings of the present invention, has been prepared with excellent results. The atmosphere used to produce the layer 16 of the sample cell was made of $H_2$ and $SiH_4$ in a ratio of 13.1 to 1, and contained $B_2H_6$ at 500 ppm. The atmosphere was maintained at a pressure of 2.0 torr and a flow rate of $4.5 \times 10^{-4}$ SCCM per cubic centimeter, within a system having a total volume of 16 liters. Rf power was discharged through the gas between opposed top and bottom electrodes 40 centimeters in diameter at a power density of approximately 0.03 watts per square centimeter. The bottom electrode was grounded. Under these conditions, the dc potential of the top electrode was allowed to float, and was measured to be approximately 50 volts, presumably due to ion bombardment of the electrode. P material deposited on a substrate of 7059 Corning (borosilicate) glass positioned between the two electrodes was found to have a band gap ($E_g$) of 1.90 eV and a dark conductivity of approximately $10^{-6}$ inverse ohm-centimeters. The photovoltaic parameters of the solar cell formed with this material were as follows: $V_{oc} = 785$ millivolts; $J_{sc} = 11.5$ milliamperes per square centimeter; and FF (fill factor) = 57%. The stability of the cell was found to be excellent, suffering only approximately 5% in $J_{sc}$ from exposure to sunlight.

Films of intrinsic amorphous silicon have also been produced according to the process of the present invention, using the parameters discussed above in relation to the layer 16 and omitting the dopant gas $B_2H_6$. The band gap of this material was found to be as high as 1.95 eV. In addition, the absorption co-efficient ($\alpha$) of the material was measured as a function of the wavelength (or energy "E") of incident light and plotted as "$\alpha E^{\frac{1}{2}}$ vs. E". The slope of the plot, which is accepted in the field as an indication of film quality, has a value of approximately 1000. This compares favorably to conventional hydrogenated amorphous silicon, which has a slope of approximately 800. The higher slope achieved with the material of the present invention indicates that the material has fewer states in the forbidden gap. It is expected that the material can be used as the intrinsic layer of the panel 10 or other photovoltaic device to improve the characteristics of the device. The higher optical gap would tend to increase the open circuit voltage ($V_{oc}$) of the device and the greater slope of the "$\alpha E^{\frac{1}{2}}$ vs. E" plot indicates that other photovoltaic parameters may be improved, as well.

While not bound by any theory, it is believed that the low flow rate described herein is critical to the method of the present invention because it prevents the silane gas from being replenished at a rapid rate during deposition. Virtually all of the silane then has time to decompose and react at the deposition surface to form the desired film. If the flow rate is over $10^{-3}$ SCCM per cubic centimeter, the gas does not fully decompose. Rather, it generates long stream polymers of silane, causing an undesired chemical "dust" to form on the deposition surface and the walls of the chamber. It is believed that this critical relationship between the flow rate and deposition product has not previously been appreciated in the semiconductor field.

The power density in the process of the present invention must be kept at or below 0.08 watts per square centimeter to prevent crystallization of the film. In fact, deposition at 0.08 watts per square centimeter cannot be continued for longer than approximately 10 minutes without running a substantial risk of crystallization.

It is believed that the gas pressure within the deposition system must be at least approximately 1 torr to assure enough $H_2$ bombardment of the deposition surface to produce the desired silicon material, and to keep the sputtering rate down to a level at which deposition can occur.

Figure 3:
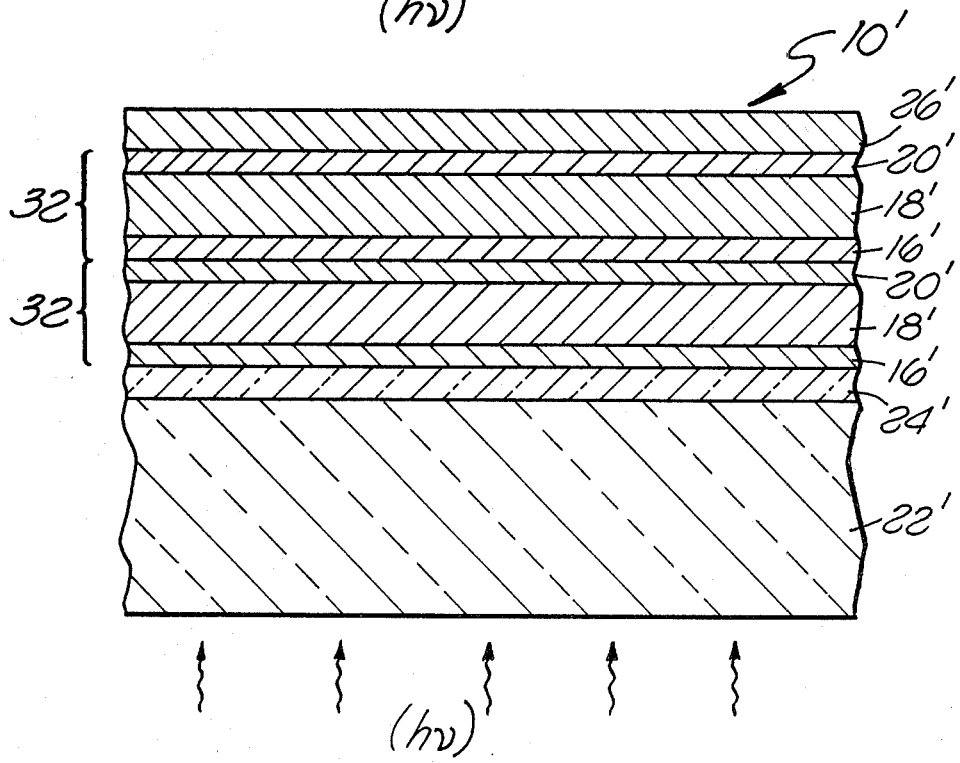
FIG. 3 is an enlarged fragmentary cross-sectional view of a tandem cell having at least one semiconductive layer formed according to the present invention.

Referring now to FIG. 3, a tandem solar cell 10' contains at least one semiconductive layer formed according to the process of the present invention. The cell has a glass substrate 22', a front contact 24' and a metallic back contact 26' which are identical to the corresponding elements of the solar panel 10. However, a pair of p-i-n cell structures 30 and 32, respectively, are provided between the front and back contacts, in place of the single cell structure 14 of the panel 10. Each of the cell structures 30 and 32 is similar in make-up to the structure 14 of the panel 10, and is made up of stacked layers 16', 18' and 20'. The p layers 16' and the intrinsic layers 18' may be made according to the process described above with regard to the layers 16 and 18 of the cell 10, resulting in higher quality amorphous films and higher optical gaps than are obtainable by the methods of the prior art. For instance, the present invention allows the intrinsic layer 18' of the outer cell 30 to have an optical gap as large as 1.95 eV, almost equaling the theoretical "best" value of 1.9 eV for the outer intrinsic layer of a tandem cell. Thus, a substantial difference in optical gap can be provided between the two intrinsic layers 18', permitting the inner and outer cell structures to more effectively utilize the solar spectrum of light. The tandem cell 10' operates in a manner similar to the solar panel 10, but with two "stacked" p-i-n structures for conversion of light to electrical energy.

The various layers of the tandem cell are similar in thickness and composition to the corresponding layers of the panel 10, except for the thickness of the intrinsic layer 18'. Because stacked cells are connected electrically in series, the current densities within the cells are necessarily equal. The thicknesses of the active layers 18' should therefore be matched to generate substantially equal current densities and optimize cell current. The parameters of such optimization are well known in the field.

From the above, it can be seen that there has been provided a process of producing hydrogenated thin film amorphous silicon material of high optical gap and good conductivity, for use in a variety of photovoltaic applications.

While certain specific embodiments of the invention have been disclosed as typical, the invention is, of course, not limited to these particular forms, but rather is applicable to all such variations as fall within the scope of the appended claims. As an example, the silicon-containing gas used in the glow discharge need not be $SiH_4$, but can be a higher silane or other suitable gas containing silicon. Similarly, the experimental values provided for the process of the present invention contemplate the use of rf power to produce a glow; however, the invention is not limited to the use of such power. For example, ac power of another frequency, or even dc power, may be used to produce the discharge. Finally, although the material produced by the process of the present invention is referred to herein as "high hydrogen" material, it will be understood that this expression refers to the hydrogen content of the gaseous discharge, and not necessarily to the amount of hydrogen contained within the deposited film.

What is claimed is:

1. A process of forming amorphous silicon from a glow discharge comprising the steps of:
   providing a gas atmosphere containing $H_2$ and $SiH_4$ in a ratio of at least approximately 9 to 1, at a flow rate of no more than $10^{-3}$ SCCM per cubic centimeter;
   establishing a glow discharge by discharging electrical power through the atmosphere at a density of no more than 0.08 watts per square centimeter; and
   exposing a substrate to the glow discharge to deposit amorphous Si:H thereon.

2. The process of claim 1 wherein:
   the pressure of the gas atmosphere is at least 1 torr.

3. The process of claim 2 wherein:
   the ratio of $H_2$ to $SiH_4$ is approximately 13 to 1.

4. The process of claim 2 wherein:
   the flow rate of the gas atmosphere is approximately $4.5 \times 10^{-4}$ SCCM per cubic centimeter.

5. The process of claim 2 wherein:
   electrical power is discharged through the atmosphere at a density of approximately 0.03 watts per square centimeter.

6. The process of claim 5 wherein:
   the electrical power is rf power.

7. The process of claim 2 wherein:
   the pressure of $H_2$ and $SiH_4$ in the gas atmosphere is approximately 2 torr.

8. The product by the process of claim 1 which has an optical gap of at least approximately 1.85 electron volts.

9. The process of claim 1 wherein:
   the ratio of $H_2$ to $SiH_4$ is approximately 13 to 1;
   the flow rate of the gas atmosphere is approximately $4.5 \times 10^{-4}$ SCCM per cubic centimeter;
   electrical power is discharged through the atmosphere at a density of approximately 0.03 watts per square centimeter; and
   the pressure of $H_2$ and $SiH_4$ in the gas atmosphere is approximately 2 torr.

10. The product by the process of claim 9 which has an optical gap of at least approximately 1.90 electron volts.

11. The process of claim 1 wherein:
    the gas atmosphere includes a preselected dopant.

12. The process of claim 11 wherein:
    the dopant comprises $B_2H_6$.

13. The process of claim 12 wherein:
    the concentration of $B_2H_6$ in the gas atmosphere is at least approximately 500 parts per million.

14. The product by the process of claim 13 which has an optical gap of at least 1.85 electron volts and a dark conductivity of at least approximately $10^{-6}$ inverse ohm-centimeters.

* * * * *